United States Patent
Marczi et al.

(10) Patent No.: US 10,123,430 B2
(45) Date of Patent: Nov. 6, 2018

(54) MATERIALS FOR USE WITH INTERCONNECTS OF ELECTRICAL DEVICES AND RELATED METHODS

(75) Inventors: Michael T. Marczi, Chester, NJ (US); Paul Koep, Madison, NJ (US); Michiel A. de Monchy, Utrecht (NL); Martinus N Finke, De Meern (NL); Brian Lewis, Branford, CT (US)

(73) Assignee: Alpha Assembly Solutions Inc., Somerset, NJ (US)

( * ) Notice: Subject to any disclaimer, the term of this patent is extended or adjusted under 35 U.S.C. 154(b) by 1707 days.

(21) Appl. No.: 11/873,838

(22) Filed: Oct. 17, 2007

(65) Prior Publication Data

US 2008/0173698 A1 Jul. 24, 2008

Related U.S. Application Data

(60) Provisional application No. 60/852,210, filed on Oct. 17, 2006, provisional application No. 60/866,913, filed on Nov. 22, 2006.

(51) Int. Cl.
*B23K 26/00* (2014.01)
*H05K 3/34* (2006.01)
(Continued)

(52) U.S. Cl.
CPC ......... *H05K 3/3484* (2013.01); *B23K 35/262* (2013.01); *B23K 35/264* (2013.01); *B23K 35/302* (2013.01); *H01L 31/02008* (2013.01); *H01L 31/048* (2013.01); *H05K 3/341* (2013.01); *H01L 23/3736* (2013.01); *H01L 24/83* (2013.01); *H01L 2224/8181* (2013.01); *H01L 2224/81825* (2013.01); *H01L 2224/8381* (2013.01); *H01L 2224/83224* (2013.01);
(Continued)

(58) Field of Classification Search
CPC .... B23K 35/302; B23K 35/264; B23K 26/00; B23K 31/02; B23K 35/262
USPC ............ 219/121.64, 121.63, 121.66, 121.65; 420/562, 558, 559, 555, 577, 570, 575; 228/179.1, 233.2, 180.22, 193, 245, 56.3; 29/840; 427/123; 438/614
See application file for complete search history.

(56) References Cited

U.S. PATENT DOCUMENTS 3,411,952 A    11/1968  Ross et al.
3,921,285 A *  11/1975  Krall ............................. 29/840
(Continued)

FOREIGN PATENT DOCUMENTS

DE    102004021570 A1    1/2005
JP    2006263774 A       10/2006

OTHER PUBLICATIONS

Lee et al. "Direct Synthesis and Inkjetting of Silver Nanocrystals Toward Printed Electronics." Nanotechnology, 17 (2006), 2424-2428.
(Continued)

*Primary Examiner* — Phuong Nguyen
(74) *Attorney, Agent, or Firm* — Carmody Torrance Sandak & Hennessey LLP

(57) ABSTRACT

Certain examples disclosed herein are directed to materials that are designed for use in interconnects of electrical devices such as, for example, printed circuit boards and solar cells. In certain examples, a two-step solder may be used to reduce stresses on the materials used in the production of the electrical devices.

8 Claims, 4 Drawing Sheets

(51) Int. Cl.
*B23K 35/26* (2006.01)
*B23K 35/30* (2006.01)
*H01L 31/02* (2006.01)
*H01L 31/048* (2014.01)
*H01L 23/373* (2006.01)
*H01L 23/00* (2006.01)

(52) U.S. Cl.
CPC ............. *H01L 2224/83801* (2013.01); *H01L 2924/01322* (2013.01); *H01L 2924/01327* (2013.01); *H01L 2924/12042* (2013.01); *H01L 2924/13055* (2013.01); *H05K 3/3463* (2013.01); *H05K 2201/0209* (2013.01); *H05K 2201/068* (2013.01); *H05K 2201/10992* (2013.01); *H05K 2203/0415* (2013.01); *Y02E 10/50* (2013.01); *Y02P 70/613* (2015.11)

(56) References Cited

U.S. PATENT DOCUMENTS

| | | | | |
|---|---|---|---|---|
| 4,346,396 | A * | 8/1982 | Carroll et al. | 257/674 |
| 4,439,918 | A * | 4/1984 | Carroll et al. | 29/840 |
| 4,664,309 | A * | 5/1987 | Allen et al. | 228/180.22 |
| 4,705,205 | A * | 11/1987 | Allen et al. | 228/180.22 |
| 4,712,161 | A | 12/1987 | Pryor | |
| 4,821,151 | A * | 4/1989 | Pryor et al. | 361/771 |
| 5,185,042 | A | 2/1993 | Ferguson | |
| 5,229,070 | A * | 7/1993 | Melton et al. | 420/557 |
| 5,527,628 | A * | 6/1996 | Anderson et al. | 428/647 |
| 5,551,627 | A * | 9/1996 | Leicht et al. | 228/180.22 |
| 6,103,868 | A | 8/2000 | Heath | |
| 6,184,062 | B1 | 2/2001 | Brofman et al. | |
| 6,319,617 | B1 * | 11/2001 | Jin et al. | 428/469 |
| 6,326,677 | B1 * | 12/2001 | Bloom et al. | 257/638 |
| 6,395,972 | B1 | 5/2002 | Tran | |
| 6,440,836 | B1 * | 8/2002 | Lu et al. | 438/612 |
| 6,945,447 | B2 * | 9/2005 | Tran et al. | 228/180.21 |
| 7,173,188 | B2 * | 2/2007 | Endo et al. | 174/94 R |
| 2001/0050181 | A1 | 12/2001 | Miura et al. | |
| 2002/0149113 | A1 * | 10/2002 | Ray et al. | 257/772 |
| 2002/0159913 | A1 * | 10/2002 | Ito et al. | 420/560 |
| 2003/0226877 | A1 * | 12/2003 | Tran et al. | 228/180.21 |
| 2004/0238966 | A1 * | 12/2004 | Bottner et al. | 257/772 |
| 2004/0245648 | A1 * | 12/2004 | Nagasawa et al. | 257/772 |
| 2005/0069725 | A1 | 3/2005 | Boaz | |
| 2005/0106059 | A1 * | 5/2005 | Farooq et al. | 420/557 |
| 2005/0129843 | A1 | 6/2005 | Wu | |
| 2006/0060638 | A1 * | 3/2006 | Farooq et al. | 228/248.1 |
| 2006/0091504 | A1 | 5/2006 | Kang et al. | |
| 2006/0104855 | A1 | 5/2006 | Rothschild | |
| 2006/0222559 | A1 * | 10/2006 | Leung | 420/560 |
| 2007/0036670 | A1 * | 2/2007 | Pereira | 420/555 |

OTHER PUBLICATIONS

International Search Report and Written Opinion for PCT/US07/81650.

* cited by examiner

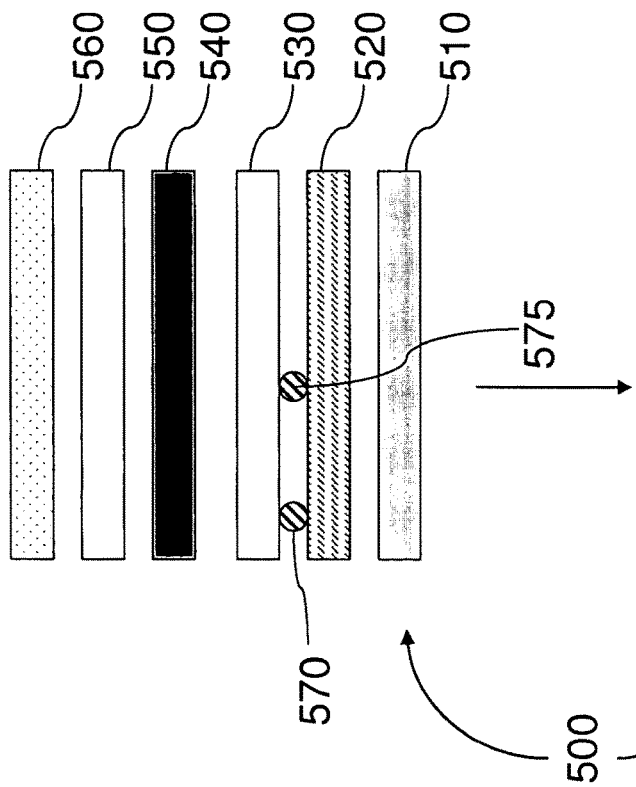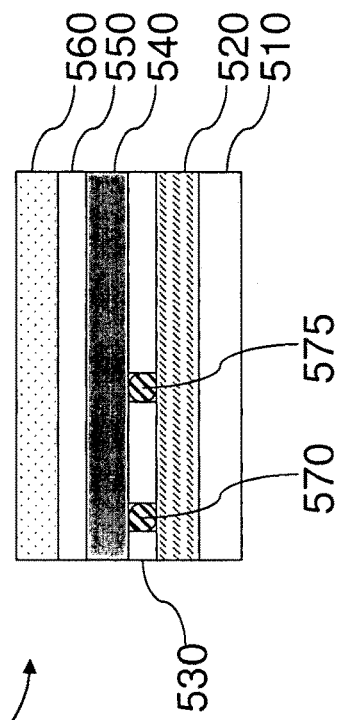

MATERIALS FOR USE WITH INTERCONNECTS OF ELECTRICAL DEVICES AND RELATED METHODS

PRIORITY CLAIM

This application claims priority to U.S. Provisional Application No. 60/852,210 filed on Oct. 17, 2006 and to U.S. Provisional Application No. 60/866,913 filed on Nov. 22, 2006, the entire disclosure of each of which is hereby incorporated herein by reference for all purposes.

FIELD OF THE TECHNOLOGY

Certain embodiments disclosed herein are directed to materials for use in interconnects, such as those found in electrical devices. More particularly, certain embodiments disclosed herein are directed to solders and methods of their use in the assembly of electrical devices such as, for example, printed circuit board, photovoltaic cells and solar panels.

BACKGROUND

Interconnects are typically used to provide electrical coupling between two or more conductors. There remain significant drawbacks, however, in the materials and methods used to provide an electrical connections in electrical devices.

SUMMARY

In accordance with a first aspect, a method of providing an electrical connection between two or more electrical components in an electrical device is provided. In certain examples, the method comprises disposing a two-step solder on or between some portion of the two or more electrical components, the two-step solder comprising a low melt solder component disposed on a base solder component, melting the low melt solder component of the two-step solder at an effective temperature to form a solder alloy or intermetallic from the low melt component and the base solder component, and soldering the solder alloy or intermetallic to provide an electrical connection between the two or more electrical components.

In certain embodiments, the soldering step comprises laser soldering the solder alloy or intermetallic. In some examples, the effective temperature to melt the low melt solder component of the two-step solder may be about 150° C. or less. In certain examples, the soldering step may be is performed at an elevated temperature to laminate the electrical device during the soldering step. In some examples, the low melt solder component of the two-step solder may be configured as a low melt solder selected from the group consisting of Sn(42)/Bi(58), Sn (30-50)/Bi(70-30), Sn(42)/Bi(57)/Ag(1), Sn(30-50)/Bi(70-30)/Ag(0-5), Sn(50)/In(50), Sn(30-50)/In(70-30), In(97)/Ag(3), In(90-100)/Ag(0-10), Sn(50)/Pb(32)/Cd(18), Sn(30-60)/Pb(20-40)/Cd(10-30), Sn(43)/Pb(43)/Bi(14) and Sn(30-50)/Pb(30-50)/Bi(5-20). In other examples, the base solder component of the two-step solder may be selected from the group consisting of SAC305 alloy, Sn(90-100)/Ag(0-5)/Cu(0-5), SACX0307 alloy, Sn(96.5)/Ag(3.5), Sn(90-95)/Ag(0-5), Sn(99)/Cu(1), Sn(95-100)/Cu(0-5), Sn(100), Sn(63)/Pb(37), Sn(20-80)/Pb(0-20), Sn(62)/Pb(36)/Ag(2), Sn(50-70)/Pb(30-50)/Ag(0-5), Sn(60)/Pb(38)/Cu(2), and Sn(50-70)/Pb(30-50)/Cu(0-5). In certain examples, the two or more electrical components may be from an electrical device selected from the group consisting of a printed circuit board, a ball grid array, and a pin grid array. In some examples, the method may further comprise disposing a sealant between the two or more electrical components prior to melting the low melt solder component of the two-step solder.

In accordance with another aspect, a method of providing an electrical connection in a solar cell assembly comprising a circuit board and a silicon-containing layer is disclosed. In certain examples, the method comprises disposing a two-step solder on or between the circuit board and the silicon-containing layer; the two-step solder comprising a low melt solder component disposed on a base solder component, melting the low melt solder component of the two-step solder to form a solder alloy or an intermetallic from the low melt solder component and the base solder component, and soldering the solder alloy or intermetallic to provide an electrical connection between the circuit board and the silicon-containing layer.

In certain embodiments, the soldering step comprises laser soldering the solder alloy or intermetallic. In additional examples, the effective temperature to melt the low melt solder component of the two-step solder may be 150° C. or less. In certain examples, the solar cell assembly may further comprise a backing layer coupled to the circuit board and a protective layer coupled to the silicon-containing layer. In some examples, the low melt solder component of the two-step solder may be configured as a low melt solder selected from the group consisting of Sn(42)/Bi(58), Sn (30-50)/Bi(70-30), Sn(42)/Bi(57)/Ag(1), Sn(30-50)/Bi(70-30)/Ag(0-5), Sn(50)/In(50), Sn(30-50)/In(70-30), In(97)/Ag(3), In(90-100)/Ag(0-10), Sn(50)/Pb(32)/Cd(18), Sn(30-60)/Pb(20-40)/Cd(10-30), Sn(43)/Pb(43)/Bi(14) and Sn(30-50)/Pb(30-50)/Bi(5-20). In other examples, the base solder component of the two-step solder is selected from the group consisting of SAC305 alloy, Sn(90-100)/Ag(0-5)/Cu(0-5), SACX0307 alloy, Sn(96.5)/Ag(3.5), Sn(90-95)/Ag(0-5), Sn(99)/Cu(1), Sn(95-100)/Cu(0-5), Sn(100), Sn(63)/Pb(37), Sn(20-80)/Pb(0-20), Sn(62)/Pb(36)/Ag(2), Sn(50-70)/Pb(30-50)/Ag(0-5), Sn(60)/Pb(38)/Cu(2), and Sn(50-70)/Pb(30-50)/Cu(0-5). In certain examples, the two-step solder disposed between the circuit board and the silicon-containing layer may be configured as a solder preform. In some examples, the method may further comprise disposing a sealant between the circuit board and the silicon-containing layer prior to melting the low melt solder component of the two-step solder.

In accordance with an additional aspect, a method of producing a solar cell assembly is provided. In certain examples, the method comprises disposing a circuit board on a backing layer, disposing at least one two-step solder preform on an electrical contact on the circuit board, the two-step solder preform comprising a low melt solder component disposed on a base solder component, disposing a solar cell on the circuit board and the at least one solder preform, disposing a protective layer on the solar cell to provide a solar cell assembly, applying least one of heat and pressure to the solar cell assembly to melt the low melt solder component to form a solder alloy or intermetallic from the low melt solder component and the base solder component, and soldering the solder alloy through the protective layer to provide an electrical connection between the circuit board and the solar cell.

In certain embodiments, the step of applying at least one of heat and pressure may be performed at a temperature of about 150° C. or less. In some examples, the step of applying at least one of heat and pressure and the soldering laminates the solar cell assembly. In certain examples, the method may further comprise disposing a layer of sealant between the solar cell and the circuit board and between the solar cell and the protective layer. In some examples, the soldering step may be performed by laser soldering.

In accordance with another aspect, a method of producing a solar cell assembly is provided. In certain examples, the method comprises disposing a circuit board on a backing layer, disposing a first sealant layer on the circuit board, disposing at least one two-step solder preform on an electrical contact on the circuit board, the two-step solder preform comprising a low melt solder component disposed on a base solder component, disposing a solar cell on the sealant and the at least one solder preform, disposing a second sealant layer on the solar cell, disposing a protective layer on the second sealant layer to provide a solar cell assembly, applying heat and pressure to the solar cell assembly to melt the low melt solder component to form a solder alloy or intermetallic from the low melt solder component and the base solder component, and laser soldering the solder alloy through the protective layer and the sealant layers to provide an electrical connection between the circuit board and the solar cell.

In certain embodiments, the step of applying heat and pressure may be performed at a temperature of about 150° C. or less. In some examples, the steps of applying heat and pressure and the laser soldering laminates the solar cell assembly.

In accordance with an additional aspect, a method of producing an electrical connection in an electrical device is disclosed. In certain examples, the method comprises disposing a solder mixed with a zero CTE material on a joint to be soldered, the solder mixed with the zero CTE material in an effective amount to reduce mismatch of the coefficient of thermal expansion of the solder and a material in the joint to be soldered, and soldering the joint to provide an electrical connection.

In certain embodiments, the zero CTE material may be selected from the group consisting of beta-eucryptite or materials having similar structural features or properties. In some examples, the method may further comprise laminating at least two layers in the electrical device simultaneously during the soldering step.

In accordance with another aspect, a method of producing an electrical connection in a solar cell assembly is provided. In certain examples, the method comprises, disposing a solder mixed with a zero CTE material between a circuit board and a solar cell, the solder mixed with the zero CTE material in an effective amount to reduce mismatch of the coefficient of thermal expansion of a material on at least one of the solar cell and the circuit board in contact with the disposed solder, and applying heat to the disposed solder to provide an electrical connection between the circuit board and the solar cell.

In certain embodiments, the zero CTE material may be selected from the group consisting of beta-eucryptite or materials having similar structural features or properties. In some examples, the method may further comprise simultaneously laminating the solar cell assembly using the applied heat.

In accordance with an additional aspect, a two-step solder comprising a low melt solder component disposed on base solder component, the low melt solder component present in an effective amount to form an alloy or intermetallic with the base solder component at a temperature of about 150° C. or less is disclosed. In certain examples, low melt solder component may be selected from the group consisting of Sn(42)/Bi(58), Sn (30-50)/Bi(70-30), Sn(42)/Bi(57)/Ag(1), Sn(30-50)/Bi(70-30)/Ag(0-5), Sn(50)/In(50), Sn(30-50)/In (70-30), In(97)/Ag(3), In(90-100)/Ag(0-10), Sn(50)/Pb(32)/Cd(18), Sn(30-60)/Pb(20-40)/Cd(10-30), Sn(43)/Pb(43)/Bi (14) and Sn(30-50)/Pb(30-50)/Bi(5-20). In some examples, the base solder component may be selected from the group consisting of SAC305 alloy, Sn(90-100)/Ag(0-5)/Cu(0-5), SACX0307 alloy, Sn(96.5)/Ag(3.5), Sn(90-95)/Ag(0-5), Sn(99)/Cu(1), Sn(95-100)/Cu(0-5), Sn(100), Sn(63)/Pb(37), Sn(20-80)/Pb(0-20), Sn(62)/Pb(36)/Ag(2), Sn(50-70)/Pb (30-50)/Ag(0-5), Sn(60)/Pb(38)/Cu(2), and Sn(50-70)/Pb (30-50)/Cu(0-5). In certain embodiments, the two-step solder may further comprise an effective amount of a zero CTE material to reduce the coefficient of thermal expansion of the two-step solder. In some examples, the low melt solder component may be coated on the base solder component. In other examples, the two-step solder may be in the form of a wire, a ribbon, a cladded ribbon, a discrete shape or a preform.

In accordance with another aspect, an electrical device comprising a first layer and a second layer is provided. In certain examples, the first layer may comprise an electrical coupling to the second layer at one or more sites, the electrical coupling comprising a solder joint formed from a two-step solder. In some examples, the first layer may comprise an electrical coupling to the second layer at one or more sites, the electrical coupling comprising a solder joint formed from a solder with a matched coefficient of thermal expansion.

In accordance with another aspect, a solar cell assembly comprising a circuit board and a solar cell is disclosed. In certain examples, the circuit board may be electrically coupled to the solar cell through a solder joint formed from a two-step solder. In some examples, the circuit board may be electrically coupled to the solar cell through a solder joint formed from a solder with a matched coefficient of thermal expansion.

It will be recognized by the person of ordinary skill in the art, given the benefit of this disclosure, that the solders and methods of using them provide significant advantages over existing solders. The lifetime of devices produced using the solders may be increased, and the steps used in producing the electrical devices may be reduced using the solders described herein. Additional features, aspects and embodiments are described in more detail below.

BRIEF DESCRIPTION OF THE FIGURES

Certain illustrative examples are described in more detail below with reference to the accompanying figures in which:

FIG. 5A is an exploded cross-section of a solar cell assembly prior to soldering and FIG. 5B is a cross-section of a solar cell assembly after soldering, in accordance with certain examples.

Figure 1:
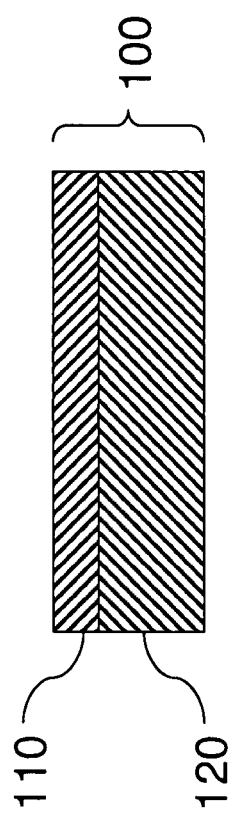
FIG. 1 is a cross-section of a two-step solder, in accordance with certain examples.

It will be recognized by the person of ordinary skill in the art, given the benefit of this disclosure, that certain dimensions, thicknesses and the like in the figures may have been enlarged, distorted, shown disproportionately or otherwise shown in a non-conventional manner to facilitate a better understanding of the technology described herein. In particular, the thickness of any one layer in the figures should not be construed to have any bearing or relationship to the thickness of any other layer shown in the figures. Also, the electrical devices may be used in any orientation relative to gravity and the particular top to bottom arrangement shown in the figures is for illustrative purposes only.

DETAILED DESCRIPTION

Certain illustrative embodiments described herein are directed to solders and preforms using them that provide improved properties for the assembly of electrical devices. Some embodiments of the solders may be used to assemble electrical devices and may reduce the likelihood of stress, strain or cracking in the electrical devices. Other embodiments of the solders may reduce the number of steps used in the assembly of an electrical device. These and other advantages are discussed in more detail below.

In accordance with a first aspect, a low melt solder or low melt solder alloy is provided. As used herein, "low melt" refers to a material that flows at an assembly temperature that is less than or equal to about 150° C., more particularly, flows between about 110° C. and about 150° C., e.g., about 115° C. and 130° C. For example, the alloy Sn48/In52 melts at a temperature of about 118° C. and may be soldered at a temperature of about 150° C. The low melt solder is desirably solid at ambient temperature to facilitate placement onto a desired surface or other material. In some examples, the solder may include a first component that is a low melt component and a second component that acts as a base solder component and flows at a temperature above 150° C. Such two-component solder alloys are referred to in certain instances as "two-step" solders or two-step solder preforms. The term "two-step" refers to the ability of the low melt solder to melt in a first step to form a solder alloy or intermetallic with a base solder component. In a second step, the alloyed solder (or intermetallic solder as the case may be) may be used to provide an electrical connection. Uses of the two-step solder in the assembly of electrical devices are discussed in more detail herein.

In accordance with certain examples, as wafer thickness are driven below 200 microns for reasons of performance and economics, process related wafer damage becomes increasingly an issue. For example, solders used in electrical interconnects may generate system stresses at high temperatures due to the differences in the material properties of the solders and the interconnects. Certain embodiments of the solders disclosed herein address such problems by allowing the reduction of assembly temperatures and/or by using low melt solders or solders with lower coefficients of thermal expansion (CTE) than existing solders to reduce CTE mismatch between the solder and the interconnects.

In accordance with certain examples, the two-step solders disclosed herein may include a first layer of a base solder material and a second layer of a low melt solder on or coating some portion of the base solder material. An illustration of this structure is shown in FIG. 1. The two-step solder 100 includes a low melt layer 110 disposed on a base solder layer 120. In certain examples, each of the low melt layer and the base solder layer may be a solder alloy. During assembly of an electrical device using the two-step solder, the low melt solder melts during a first assembly temperature of about 150° C. or less. Such low assembly temperatures reduce cracking and the stresses placed on materials and component such as certain polymeric materials. As the low melt solder melts, it can form an alloy or intermetallic with the base solder material resulting in a layer with a melting temperature higher than that of the low melt solder. Using the two-step solder, the resulting material can better tolerate higher soldering temperatures without softening or melting and thus permits the electrical device to be soldered to withstand higher soldering and operating temperatures. In addition, the thermal shocks experienced by the electrical device in its use environment may be better tolerated.

In accordance with certain examples, the exact thickness of each layer of the two-step solder may vary. In certain embodiments, the thickness of the low melt solder is selected such that it is thick enough to form an intermetallic with the base solder material but no so thick that soldering of the base material or the intermetallic would be adversely affected. In some examples, the low melt solder layer has an effective thickness such that an alloy or intermetallic is formed with the base solder material upon heating of the two-step solder. In some examples, the low melt solder layer is about 0.01 mm thick to about 0.25 mm thick, more particularly about 0.03 mm thick to about 0.10 mm thick, e.g., about 0.01 mm thick to about 0.015 mm thick. In certain embodiments, the base solder layer is about 0.05 mm thick to about 0.40 mm thick, more particularly about 0.20 mm thick to about 0.30 mm thick, e.g., about 0.20 mm thick to about 0.25 mm thick. Similarly, the exact form that the two-step solder may take can vary, and in certain examples, the two-step solder may be in the form of a wire, ribbon, cladded ribbon, or a discrete shape such as, for example, a disc, rectangle, washer, sphere or other suitable shape. Additional thicknesses and shapes will be readily selected by the person of ordinary skill in the art, given the benefit of this disclosure.

In accordance with certain examples, the low melt solder of the two-step solder may include any suitable material or materials that can melt or flow at an assembly temperature less than or equal to about 150° C. The low melt solder may be, for example lead-free, cadmium-free, lead- and cadmium-free, lead-containing, cadmium-containing or lead- and cadmium-containing. Illustrative lead- and cadmium-free low melt solders include, but are not limited to, tin/bismuth solders, tin/bismuth/silver solders, tin/indium solders, indium/silver solders, indium/silver solders and the like. Specific examples of lead- and cadmium-free solders include, but are not limited to, the following (with the numbers in parenthesis referring to the weight percentages of each component): Sn(42)/Bi(58), Sn (30-50)/Bi(70-30), Sn(42)/Bi(57)/Ag(1), Sn(30-50)/Bi(70-30)/Ag(0-5), Sn(50)/In(50), Sn(30-50)/In(70-30), In(97)/Ag(3), and In(90-100)/Ag(0-10). A particularly useful lead- and cadmium-free low melt solder is Sn(50)/In(50) which melts between 117-125° C. Illustrative examples of lead or cadmium containing solders include, but are not limited to, tin/lead/cadmium solders and tin/lead/bismuth solders. Specific examples of lead and cadmium containing solders include, but are not limited to the following (with the numbers in parenthesis referring to the weight percentages of each component): Sn(50)/Pb(32)/Cd(18), Sn(30-60)/Pb(20-40)/Cd(10-30), Sn(43)/Pb(43)/Bi(14) and Sn(30-50)/Pb(30-50)/Bi(5-20). Additional examples of low melt solders suitable for use in the devices and methods disclosed herein will be readily selected by the person of ordinary skill in the art, given the benefit of this disclosure.

In accordance with certain examples, the base solder material may be any material that is conductive, to at least some degree, and melts at a higher temperature than the low melt solder layer. In some examples, the base solder material may be selected such that it can form an intermetallic with the low melt solder. In other examples, the base solder material may have a melting point or range higher than the low melt solder. The base solder material may be, for example, lead-free, cadmium-free, lead- and cadmium-free, lead-containing, cadmium-containing, lead- and cadmium-containing or may be copper ribbon, aluminum ribbon or other ribbons coated with the base solder materials. Illustrative examples of lead- and cadmium-free base solder materials include, but are not limited, to the following (with the numbers in parenthesis referring to the weight percentages of each component): SAC305 alloy, Sn(90-100)/Ag(0-5)/Cu(0-5), SACX0307 alloy, Sn(96.5)/Ag(3.5), Sn(90-95)/Ag(0-5), Sn(99)/Cu(1), Sn(95-100)/Cu(0-5), Sn(100), Sn(63)/Pb(37), Sn(20-80)/Pb(0-20), Sn(62)/Pb(36)/Ag(2), Sn(50-70)/Pb(30-50)/Ag(0-5), Sn(60)/Pb(38)/Cu(2), and Sn(50-70)/Pb(30-50)/Cu(0-5) or copper or aluminium ribbon plated with one of these materials. SAC305 and SACX307 are described, for example, in U.S. Pat. No. 4,929,423. The alloy SAC305 consists of Sn96.5 Ag3.0 Cu0.5. Additional examples of base solder materials suitable for use in the devices and methods disclosed herein will be readily selected by the person of ordinary skill in the art, given the benefit of this disclosure.

In accordance with certain examples, the solders disclosed herein may take the form of a solder preform. A solder preform typically comprises solder formed into a desired shape, pattern, thickness or the like that may be disposed on or near a component of an electrical device. The preforms may take various shapes such as, for example, washers, discs, squares, rectangles and the like. The exact dimensions of the preform may vary and in certain examples, the preform may be about 0.01 inches$^2$, 0.01 inches diameter, 0.03 inches outer diameter or have other suitable dimensions to assure solder volume accuracy and solder placement. In embodiments where the solder preform takes the shape of a sphere, the sphere may have a diameter, for example, of about 0.003 inches or larger. Embodiments of solder preforms provide significant advantages including, but not limited to, controlled solder volume, decrease in assembly time, automated placement and the like.

In accordance with certain examples, a solder having a low coefficient of thermal expansion (CTE) is disclosed. In some examples, the low CTE solder may be used to avoid material mismatch in electrical components, which can reduce the lifetime and reliability of electrical devices. In certain examples, low CTE alloys are particularly effective in reducing CTE mismatch between the component parts of an assembly. In processing, the expansion mismatch between the parts may be reduced (or minimized in certain cases) such that on solder solidification, the stress that develops on cooling may also be reduced. Further, in use, the thermal cycling that the device experiences may also lead to stresses. These stresses may also be reduced by the selection of a CTE balanced solder thereby extending device life.

In accordance with certain examples, in considering the melting temperature of a solder it is desirable to select one appropriate to the assembly temperature and/or the operating temperature of the device. Under many circumstances, the lower the solder temperature, the lower the expansion and expansion mismatch both in elevated temperature processing and in temperature cycling during use of the device. Thus, the low melt solders disclosed herein typically provide a low CTE suitable for use to reduce CTE mismatch between the solders and the components of the electrical devices to be soldered.

In certain examples, the management of CTE in a solder may be achieved by metal matrix composite (MMC) principles. The solder matrix may be filled to the necessary level with a low CTE component to achieve a desired design level. A further benefit of this MMC approach is that other properties can be engineered into the solder. Higher thermal conductivity can be provided and, depending on the solder matrix, higher electrical conductivity may also be provided. By using the compositions and methods disclosed herein, low melting solders previously considered unsuitable for electrical device assembly, e.g., SnBi eutectic, may be a viable option in the assembly of electrical devices.

In accordance with certain examples, the solders described herein may be combined with one or more zero CTE materials. A zero CTE material refers to a material whose coefficient of thermal expansion is about zero at an assembly temperature. In some examples, a solder having a CTE higher than desired may be combined with an effective amount of a zero CTE material to reduce the overall CTE of the composite. The amount of zero CTE filler used is desirably limited to the least amount that can provide a desired overall CTE. The exact amount depends, at least in part, on the material's CTE, the desired CTE, the electrical device to be produced, the assembly temperature and the like. In some examples, the amount of zero CTE filler may be between about 1% by weight and about 20% by weight, more particularly, between about 1% by weight and about 15% by weight, e.g., about 1% by weight to about 10% by weight. Illustrative zero CTE materials include, but are not limited to, beta-eucryptite or materials having similar structural features or properties. Additional zero CTE materials will be readily selected by the person of ordinary skill in the art, given the benefit of this disclosure.

In accordance with certain examples, a solder comprising a CTE between about 2-23 ppm/° C. is provided. In some examples, the solder may also have a melting point between about 100° C.-350° C. In additional examples, the solder may include a base solder material and a coating of a low melt solder on the base solder material. In certain examples, the solder may be a preform to facilitate assembly. In other examples, the solder may be a solder alloy, such as any of those described herein. In some examples the solder may be used in producing electrical devices.

Figure 2:
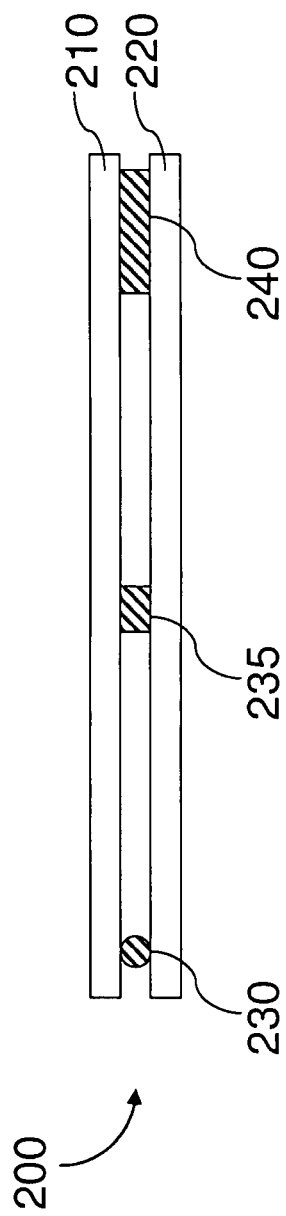
FIG. 2 is cross-section of an electrical device that includes a first layer and a second layer, in accordance with certain examples.

In accordance with certain examples, the solders disclosed herein may be used in a low temperature solder assembly operation. A schematic of such a low temperature soldering operation is shown in FIG. 2. An electrical device 200 comprises a first sheet 210 and a second sheet 220, each of which may be one or more layers of a printed circuit board, for example. It is desirable to make an electrical connection between various components on the first sheet 210 and the second sheet 220. A plurality of solder preforms 230, 235 and 240 have been placed at desired locations between the first sheet 210 and the second sheet 220. Each of the solder preforms 230, 235 and 240 may include or be a low melt solder. At an assembly temperature of less than about 150° C., the low melt solder melts to provide an electrical connection between the first sheet 210 and the second sheet 220. In examples where the low melt solder is deposited on a base solder material, melting of the low melt solder may produce a solder alloy or an intermetallic. This solder alloy or intermetallic may undergo further processing, e.g., laser soldering or the like, or may provide a permanent electrical connection without any further processing.

Figure 3:
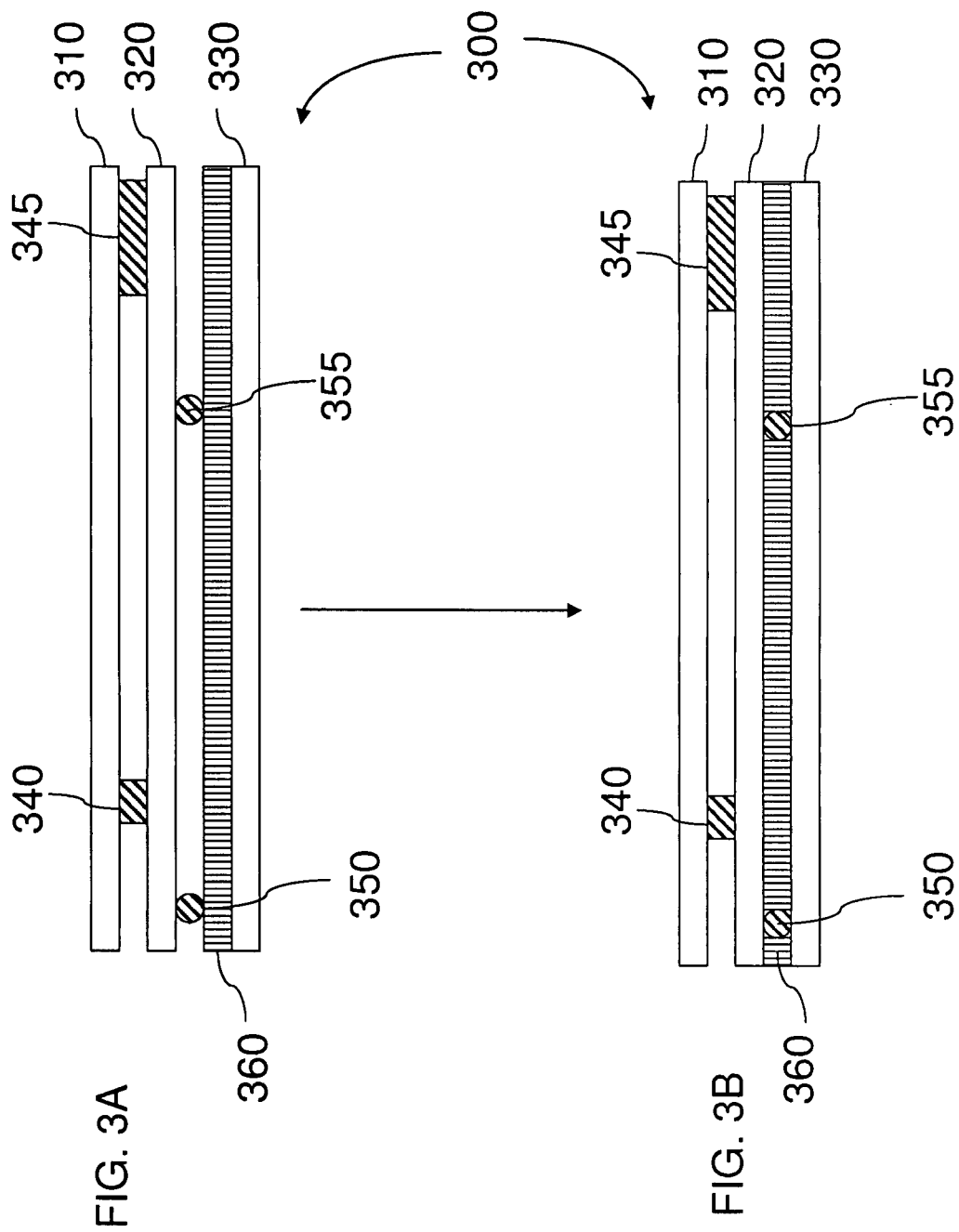
FIG. 3A is a cross-section of a multilayered electrical device prior to soldering and FIG. 3B is a cross-section of a multilayered electrical device after soldering, in accordance with certain examples.

In accordance with certain examples, the solders and solder alloys disclosed herein may be particularly useful where the electrical device includes multiple layers or materials that are to be laminated or otherwise joined to each other. Such methods are referred to in certain instances as a "two-step" method with the first step being melting of the low melt solder (and optionally lamination depending on the temperature) and the second step being soldering (and lamination if not performed in the first step). In certain embodiments, lamination and soldering may be performed in the same step to reduce the number of steps needed in the assembly operation. A schematic of such a method to assemble a multilayer electrical device is shown in FIGS. 3A and 3B. An electrical device 300 includes a first layer 310, a second layer 320 and a third layer 330. Additional layers are also possible but for illustrative purposes only three layers are shown in the electrical device 300. Solder preforms 340, 345, 350 and 355 have been placed between the various layers prior to heating or assembly of the electrical device 300. The solder preforms 340, 345, 350 and 355 may each by a low melt solder or may include a low melt solder, e.g., as a coating in a two-step solder preform. The electrical device 300 may also include a sealant or gasket layer 360. During assembly of the electrical device 300, the low melt solder of the solder preforms may melt at an assembly temperature of less than or equal to about 150° C., e.g., about 125-150° C. Melting of the low melt solder either provides an electrical connection, e.g., in the case where the low melt solder is present by itself, or forms a solder alloy or intermetallic with a base solder material, e.g., in the case where the low melt solder is a component of a two-step solder. The electrical device may undergo another processing step where the solder preforms are soldered, e.g., laser soldered, to provide a permanent electrical connection. Such additional steps are typically used where the solder preform takes the form of a two-step solder. During soldering, the solder alloy or base solder material may flow to provide a final electrical connection. The sealant 360 may also flow or be evaporated to laminate the layers of the electrical device. During lamination, the sealant desirably does not disturb the solder preforms which would disrupt the electrical connection, but instead remains around and outside the solder preforms as shown in FIG. 3B. The lamination and soldering may be preformed in a single step at a higher temperature, e.g., about 250° C. or more, without the formation of any substantial cracks or voids that would reduce the quality of the electrical connections. Examples of multilayer electrical devices that may be assembled using the two-step method includes, but are not limited to, printed circuit boards, ball grid arrays, pin grid arrays, surface-mounted device components, power modules, high current inverters, IGBT modules, heat sink attachment to other electrical devices and the like. Illustrative sealant materials that may be used between the layers of a multilayer device include, but are not limited to, ethyl vinyl acetate (EVA), polyvinylbutyral (PVB) and crosslinkable polymeric materials. In certain examples, the sealant may be used to provide a mechanical bond, at least for some period, during assembly and/or use of the final assembled device. Additional sealant materials will be readily selected by the person of ordinary skill in the art, given the benefit of this disclosure.

In accordance with certain examples, the solders described herein may be used to produce photovoltaic (PV) cells and/or to produce solar cells. In particular, the solders disclosed herein may desirably be used to connect solar cells. For example, solar cell interconnects are used to electrically connect a first PV cell to a second PV cell or to a terminal in an array of PV cells. Such interconnects may be used to connect the PV cells of a solar cell array in either a parallel or a series configuration, or both. In addition, PV cell interconnects and the electron yield collection buses may be bonded to silicon in elevated temperature processes. In certain examples, the solar cell structure may be comprised of a number of materials including, but not limited to, silicon, CIGS (a compound of copper, indium, gallium and selenium ($Cu(In,Ga)Se_2$)), silver frits, aluminum frits, copper bus bars and/or tin-based solders. From a low value of about 2 ppm/° C. for silicon, to a high value of about 28 ppm/° C. for a typical solder, there is considerable coefficient of thermal expansion (CTE) mismatch in the assembly. The CTE mismatches result in system stresses from elevated temperature processing and are also induced in use where operating temperatures of a solar cell can cycle between −40° C. and greater than 130° C. These thermal stresses negatively impact the manufacturing yield and operating life of solar cells through catastrophic micro-cracks. Approaches taken by the solar cell industry to eliminate micro-cracking includes the use of more compliant materials to accommodate stresses, e.g., annealed copper and the use of low CTE bus materials, e.g., Invar® materials. These particular engineering solutions have not been effective in avoiding cracking of the wafer or the cracking in the interfaces between the disparate CTE elements.

Figure 4:
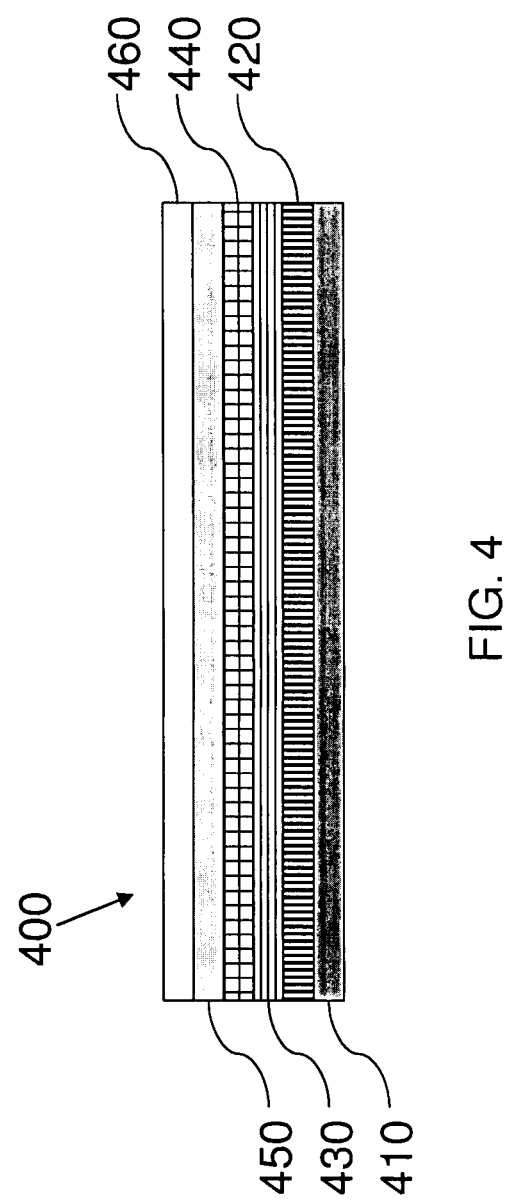
FIG. 4 is a cross-section of a solar cell assembly, in accordance with certain examples.

In accordance with certain examples, a typical PV Cell is shown in FIG. 4. The PV cell 400 comprises a multilayer and multi-material structure. The PV cell comprises a backing 410 coupled to a p-type semiconductor layer 420. The p-type semiconductor layer is coupled to an n-type semiconductor layer 430. The n-type semiconductor layer 430 is coupled to a contact grid 440. The contact grid 440 may be coupled to an antireflection layer 450. The antireflection layer 450 may be coupled to a protective film or layer 460 such as, for example, glass. In operation of the PV cell, light is exposed to the PV cell 400 and can cause electrons to flow from the n-side to the p-side of the PV cell 400 resulting in a current and/or voltage. A typical solar cell includes a plurality of PV cells (e.g., 36 or more) in an array to achieve useful levels of current. The incident light, along with ambient temperature changes, results in expansion and contraction of the various materials at different rates due to the differences in coefficients of thermal expansion of the different materials. Such CTE differences can result in gaps or cracks in the interconnects between PV cells and reduce the overall efficiency and lifetime of the PV cell. In addition, the connections between the current collector and the PV cells may be disrupted causing premature failure of the solar panel.

In accordance with certain embodiments, the solders disclosed herein may be used to increase the yield in producing solar cells, or components thereof, by reducing the CTE mismatch between the various components in the solar cells. In some examples, the solder may be used in the assembly of solar cells where CTE mismatch coupled with relatively high processing temperatures results in system stresses that exceed the fracture strength of critical components within the assembly. A specific example in the context of a solar cell is the connection of copper buses to a wafer by silver trace electron collectors. The solders described herein for reducing CTE mismatch, e.g., the low melt solders and the two-step solders, in solar cells are particularly useful for fragile thin wafer assemblies but are also applicable to thicker PV semiconductor assemblies. In some examples, the solder may be, for example, any one or more of the solders or solder alloys described herein.

In certain examples, low CTE alloys are particularly effective in reducing CTE mismatch between the components of a solar cell. In processing, the expansion mismatch between the various solar cell components is reduced (or minimized in certain cases) such that on solder solidification, the stress that develops on cooling is also reduced. Further, in use, the thermal cycling that the device experiences also leads to stresses. These stresses may also be reduced by the selection of a CTE balanced solder thereby extending device life.

In accordance with certain examples, the solders disclosed herein may be used to produce solar cells more rapidly than those produced using conventional solders. In particular, soldering and lamination may be preformed in a single step to produce a solar cell. For example, polycrystalline silicon may be attached to the p-side of the solar cell to collect current. In one embodiment as shown in FIGS. 5A and 5B, a solar cell assembly 500 (shown in an exploded view in FIG. 5A) may include a backing panel 510, a flexible circuit board 520, a first layer of ethyl vinyl acetate 530, a silicon solar cell 540, a second layer of ethyl vinyl acetate (EVA) 550 and a cover panel of glass 560. The assembly may be produced by laminating the layers 510-560. During lamination, the EVA layers 530 and 550 may soften and spread to form a seal to the circuit board 520. To provide an electrical connection from the solar cell 540 to the circuit board 520, a solder preform, such as solder preforms 570 and 575, may be used. The solder preform(s) may be placed on electrical contacts located on the circuit board 520 and can melt or soften to provide an electrical connection between the solar cell 540 and the circuit board 520. A low melt solder preform may be used such that during lamination of the components at about 150° C. or less, an electrical connection may be created between the circuit board and the solar cell. This electrical connection may result as a low melt solder melts and electrically couples the electrical contacts or may result as the low melt solder melts and forms an alloy or intermetallic with a base solder material, e.g., in the case of a two-step solder.

In certain examples, one or more additional processing steps may be performed to increase the reliability of the electrical connection and laminate the various layers of the solar cell assembly 500 together. For example, the entire assembly may be heated such that the solder preform melts and flows. Alternatively, selected areas of the solar cell assembly 500 may be heated such that the temperature of different areas may differ. One particularly desirable method is to use laser soldering to selectively heat the solder preforms to provide an electrical connection between the circuit board 520 and the solar cell 540. Laser soldering uses a laser to focus energy on selected areas of the solar cell assembly such that the heating is limited to the selected areas to minimize other areas to exposure of heat that may damage heat sensitive components. Heating of the selected areas results in melting and reflowing of the solder to provide an electrical connection. A typical laser soldering operation uses a YAG, Nd:YAG, diode, or other laser (any of which may be continuous wave or pulsed) to melt and reflow the solder. In some examples, two or more lasers may be used to melt simultaneously all the solder preforms to reduce further the time required to produce electrical devices. While the use of laser soldering is desirable, the electrical devices, including the solar cell assemblies, may also be produced using conventional soldering methods such as, for example, wave soldering and conventional reflow. In embodiments where the components of the electrical device are not heat sensitive, it may be more economical or easier to use conventional soldering methods.

In accordance with certain examples, the exact materials used in the solar cell may vary. In certain embodiments single-crystal silicon, polycrystalline silicon or amorphous crystalline may be used. Other materials suitable for use include, but are not limited to, semiconductors such as gallium arsenide, copper indium diselenide and cadmium telluride. The exact material selected may depend, at least in part, on the particular wavelength of solar energy that is to be captured. Because different materials have different band gaps, they are designed to absorb different wavelengths, or photons of different energies. One way to further improve efficiency is to use two or more layers of different materials with different band gaps. The higher band gap material may be on the surface, absorbing high-energy photons while allowing lower-energy photons to be absorbed by a lower band gap material beneath. This technique can result in much higher efficiencies. Such cells are referred to in certain instances as multi-junction cells. Such multi-junction cells may be produced using the materials and methods described herein.

In accordance with certain examples, the exact sealant used between the various layers of the solar cell may vary. In certain embodiments, the sealant may be effective to mechanically bond the strings of cells to the glass and thus assist in maintaining their positions over the life of the module. In other examples, the sealant may also provide an optical bridge between the glass and the cells (otherwise there may be another air-glass interface and an air silicon interface each causing some loss in efficiency. The sealant may have excellent light transmission properties and be durable enough to last for the use lifetime of the solar cell without substantial degrading or debonding from the glass or the silicon. Illustrative sealants also may be effective to seal the internal structures of the solar cell assembly from the external environment. For example, the use environment of a solar cell includes variations in humidity, weather and temperature. Preferably, the internal electrical components of the solar cell assemblies may be sealed from the external environment to avoid damage to such components. Suitable sealants include, but are not limited to, curable resins and rosins, thermoplastics, thermosets, ethyl vinyl acetate (EVA), polyethylene based materials, polypropylene based materials, polyamide based materials, polyester based materials, and polyvinylbutyral. Additional suitable sealants for use in the assembly of solar cells will be readily selected by the person of ordinary skill in the art, given the benefit of this disclosure.

In accordance with certain examples, the solders and solder alloys disclosed herein may be used with one or more fluxes. Particularly desirable fluxes are disclosed in U.S. Provisional Application No. 60/942,950 filed on Jun. 8, 2007 and entitled "FLUX FORMULATIONS," the entire disclosure of which is hereby incorporated herein by reference for all purposes. In particular, flux may be coated or pre-coated onto a desired portion of an electrical component prior to assembly. A solder or solder alloy as described herein may be deposited on the flux and soldering may be performed to provide an electrical connection between two or more electrical components.

In accordance with certain examples, a two-step solder comprising a low melt solder component disposed on base solder component is provided. In certain examples, the low melt solder component may be coated on the base solder component. In some examples, the low melt solder component may be present in an effective amount to form an alloy or intermetallic with the base solder component at a temperature at or below 150° C. The low melt solder component may be any one or more of the low melt solders disclosed herein such as, for example, Sn(42)/Bi(58), Sn (30-50)/Bi (70-30), Sn(42)/Bi(57)/Ag(1), Sn(30-50)/Bi(70-30)/Ag(0-5), Sn(50)/In(50), Sn(30-50)/In(70-30), In(97)/Ag(3), In(90-100)/Ag(0-10), Sn(50)/Pb(32)/Cd(18), Sn(30-60)/Pb(20-40)/Cd(10-30), Sn(43)/Pb(43)/Bi(14) and Sn(30-50)/Pb(30-50)/Bi(5-20). Similarly, the base solder component may be any one or more of the base solder materials disclosed herein such as, for example, SAC305 alloy, Sn(90-100)/Ag(0-5)/Cu(0-5), SACX0307 alloy, Sn(96.5)/Ag(3.5), Sn(90-95)/Ag (0-5), Sn(99)/Cu(1), Sn(95-100)/Cu(0-5), Sn(100), Sn(63)/Pb(37), Sn(20-80)/Pb(0-20), Sn(62)/Pb(36)/Ag(2), Sn(50-70)/Pb(30-50)/Ag(0-5), Sn(60)/Pb(38)/Cu(2), and Sn(50-70)/Pb(30-50)/Cu(0-5). In certain examples, the coefficient of thermal expansion of the solder may be reduced by mixing the solder with an an effective amount of one or more zero CTE materials. Illustrative zero CTE materials include those described herein. The exact form of the two-step solder may vary and in certain examples, the solder may take the form of a wire, a ribbon, a cladded ribbon, a discrete shape or a preform.

In accordance with certain examples, a multilayer electrical device produced using a two-step solder is provided. In certain examples, the electrical device comprises a first layer and a second layer with the first layer comprising an electrical coupling to the second layer at one or more sites and with the electrical coupling comprising a solder joint formed from a two-step solder. Any of the two-step solders described herein may be used to provide the soldered joint. In addition, a two-step soldered mixed with a selected amount of a zero CTE material may also be used.

In accordance with certain examples, a multilayer electrical device produced using a solder with a matched coefficient of thermal expansion is disclosed. In certain examples, the electrical device comprises a first layer and a second layer with the first layer comprising an electrical coupling to the second layer at one or more sites. In some examples, the electrical coupling may comprise a solder joint formed from a solder with a matched coefficient of thermal expansion. As used herein "matched coefficient of thermal expansion" refers to a solder whose coefficient of thermal expansion differs from that of the material to which the solder is to be soldered by less than about 5%, more particularly, less than about 1-2%. Any of the two-step solders described herein may be used to provide the soldered joint provided that the CTE is matched. In addition, a two-step soldered mixed with a selected amount of a zero CTE material may also be used to provide a solder with a matched CTE.

In accordance with certain examples, a solar cell assembly comprising a circuit board and a solar cell electrically coupled to each other through a solder joint formed from a two-step solder is provided. Any of the two-step solders described herein may be used to provide the solder joint. In addition, a two-step soldered mixed with a selected amount of a zero CTE material may also be used.

In accordance with certain examples, a solar cell assembly comprising a circuit board electrically coupled to a solar cell through a solder joint formed from a solder with a matched coefficient of thermal expansion is disclosed. Any of the two-step solders described herein may be used to provide the soldered joint provided that the CTE is matched. In addition, a two-step soldered mixed with a selected amount of a zero CTE material may also be used to provide a solder with a matched CTE.

In accordance with certain examples, a solder comprising a low CTE and a modulus effective to reduce transfer of any residual stress to an interface, e.g., a layered lead-free alloy solder, is provided. In certain examples, the solder may be any one or more of the solders or solder alloys described herein such as, for example, the Sn/Ag or In solders described herein, that have a low CTE and an effective modulus. In some examples, such solders may be used in producing electrical devices as described herein.

In accordance with certain examples, a solder comprising a low CTE and a modulus effective to accommodate any residual stresses by creep strain, e.g., typical indium based composite solder, is disclosed. In certain examples, the solder may be a solder or solder alloy, such as, for example, the Sn/Ag or In alloys described herein, that have a low CTE and an effective modulus. In some examples, the solder may be used in producing electrical devices as described herein. In certain examples, the electrical device may be a printed circuit board, a PV cell or may be used in the production of solar cells.

In accordance with certain examples, a solder comprising a composite with improved thermal and electrical conduction properties resulting from a composite filler material in the solder is provided. In some examples, an effective amount of filler is present to provide a desired physical or electrical property, e.g., an effective amount of a metal or zero CTE material may be used. For example, the solder may be a solder alloy, e.g., Sn/Ag with 30% molybdenum and having a thermal conductivity greater than about 70 W/mK versus about 60 W/mK for Sn/Ag alone. In some examples, the solder may be used in producing electrical devices as described herein. In certain examples, the electrical device may be a printed circuit board, a PV cell or may be used in the production of solar cells.

In accordance with certain examples, a solder comprising a composite with a low CTE, selected modulus and improved thermal and electrical conduction properties resulting from a composite filler material is disclosed. In certain examples, the solder may be a solder alloy, such as the Sn/Ag or In solders described herein. In some examples the solder may include one or more fillers or materials to provide a desired physical or electrical property. In certain examples, the solder may be used to produce an electrical device as disclosed herein. In some examples, the electrical device may be a printed circuit board, a PV cell or may be used in the production of solar cells.

In accordance with certain examples, a solder comprising selected mechanical properties produced by composite materials technology e.g., the incorporation of low CTE fillers into the solder, is provided. In certain examples, the solder may be a solder alloy such as those described herein. In some examples, the solder may be used in producing PV cells or in the production of solar panels.

In accordance with certain examples, a solder that can be used with conventional soldering processes and solders for low voiding applications that can be processed by standard fluxless assembly are disclosed. In certain examples, the solder may be a solder alloy such as those described herein. In some examples the solder may be used in producing PV cells or in the production of solar panels.

Certain specific examples are described in more detail below to further illustrative certain aspects and features of the technology described herein.

Example 1

A solder alloy may be produced by combining tin, silver and molybdenum in suitable amounts. In one embodiment, a tin/silver solder (96.5 Sn/3.5 Ag) is combined with 30% by weight molybdenum to provide a solder alloy having a coefficient of thermal expansion of about 13 ppm/° C.

Example 2

A solder alloy may be produced by combining a suitable amount of indium and molybdenum. In one embodiment, an indium solder is combined with 28% by weight molybdenum to provide a solder alloy having a coefficient of thermal expansion of about 9 ppm/° C.

Example 3

A solder alloy may be produced by combining a suitable amount of tin, silver and Invar material. In one embodiment, a tin/silver solder (96.5 Sn/3.5 Ag) is combined with 31% by weight Invar material to provide a solder alloy having a coefficient of thermal expansion of about 6.9 ppm/° C.

Example 4

A solder alloy may be produced by combining a suitable solder with one or more other metals or materials including one or more other metals. The coefficient of thermal expansion of such solder alloy may be reduced by combining the solder alloy with one or more zero CTE fillers such as, for example, beta-eucryptite.

Example 5

A solder preform consisting of two layers of solder material can be placed on a heat sink and attached to the heatsink by heating to a temperature at which the lower melting solder alloy will form a solder joint with the heat sink. In the next process step the component is placed on top of the preform and the complete assembly device is heated for instance with a laser to form the solder connection.

Example 6

A solar cell assembly that includes an entire array (ex: 6×10 cells, etc.) of solar cells is comprised of a multilayer structure that includes an organic backing panel, a flexible circuit board made up of copper and epoxy (materials common to the circuit board industry), EVA (ethyl vinyl acetate), the silicon solar cell, EVA and a cover panel of glass. This structure is made by laminating all of the layers described at 150° C. and under low pressure by pressing the EVA against the cells and the window and heating the material while evacuating the air in a laminator. This causes the two EVA layers to soften and spread and form a semi hermetic seal to the flexible circuit board and the solar cell. In addition, an electrical connection is made from the back of the solar cell to the circuit board. The initial connection is made using a two-step solder preform that softens and melts at about 150° C. The preform is placed on the electrical contact pads located on the circuit board and performs one or more of the following functions: it softens at lamination temperatures to avoid breaking the fragile solar cell, it provides electrical contact between the solar cell and the circuit board, and reduces or stops the spread of EVA onto the electrical contacts.

To produce the solar cell assembly, the circuit board may be attached to the backing. A film of ethyl vinyl acetate (EVA) is placed on the circuit board. Two-step solder preforms may be placed on electrical contacts located on the circuit board. A silicon solar cell is placed on the EVA film and on the two-step solder preforms. A second EVA film is placed on the silicon solar cell. A glass sheet is placed on the second EVA film.

Heat (about 150° C.) and low pressure, as described above, are applied to the entire assembly to melt the low melt solder to provide an initial electrical connection. The softening of the low melt solder also avoids breaking the fragile solar cell, and stops the spread of EVA onto the electrical contacts. The base solder component of the two-step solder may be laser soldered through the glass and EVA films to provide a final electrical connection.

When introducing elements of the examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples can be interchanged or substituted with various patent applications or publications incorporated herein by reference conflict with the meaning of the terms used in this disclosure, the meaning of the terms in this disclosure are intended to be controlling.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. A method of providing an electrical connection in a solar cell assembly comprising a circuit board and a silicon-containing layer, the method comprising:
    disposing a two-step solder on or between the circuit board and the silicon-containing layer, the two-step solder comprising a low melt solder component disposed on a base solder component;
    subjecting the low melt solder component to a first processing step of melting the low melt solder component of the two-step solder to form a solder alloy or an intermetallic from the low melt solder component and the base solder component; and thereafter
    laser soldering the solar cell assembly at an effective temperature to provide an electrical connection between the circuit board and the silicon-containing layer;
    wherein the solar cell assembly further comprising a backing layer coupled to the circuit board and a protective covering coupled to the silicon-containing layer.

2. The method of claim 1, in which the effective temperature to melt the low melt solder component of the two-step solder is about 150° C. or less.

3. The method of claim 2, wherein the effective temperature to solder the alloy or intermetallic layer is at least about 250° C.

4. The method of claim 1, in which the low melt solder component of the two-step solder is configured as a low melt solder selected from the group consisting of Sn(42)/Bi(58), Sn (30-50)/Bi(70-30), Sn(42)/Bi(57)/Ag(1), Sn(30-50)/Bi(70-30)/Ag(0-5), Sn(50)/In(50), Sn(30-50)/In(70-30), In(97)/Ag(3), In(90-100)/Ag(0-10), Sn(50)/Pb(32)/Cd(18), Sn(30-60)/Pb(20-40)/Cd(10-30), Sn(43)/Pb(43)/Bi(14) and Sn(30-50)/Pb(30-50)/Bi(5-20).

5. The method of claim 4, in which the base solder component of the two-step solder is selected from the group consisting of Sn(90-100)/Ag(0-5)/Cu(0-5), Sn(96.5)/Ag(3.5), Sn(90-95)/Ag(0-5), Sn(99)/Cu(1), Sn(95-100)/Cu(0-5), Sn(100), Sn(63)/Pb(37), Sn(20-80)/Pb(0-20), Sn(62)/Pb(36)/Ag(2), Sn(50-70)/Pb(30-50)/Ag(0-5), Sn(60)/Pb(38/Cu(2), and Sn(50-70)/Pb(30-50)/Cu(0-5).

6. The method of claim 5, wherein the base solder component of the two-two solder is about Sn96.5 Ag3.0 Cu0.5 or about Sn99.0 Ag0.3 Cu0.7.

7. The method of claim 1, in which the two-step solder disposed between the circuit board and the silicon-containing layer is configured as a solder preform.

8. The method of claim 1, further comprising disposing a sealant between the circuit board and the silicon-containing layer prior to melting the low melt solder component of the two-step solder.

* * * * *